United States Patent
Lee et al.

(10) Patent No.: US 10,270,021 B2
(45) Date of Patent: Apr. 23, 2019

(54) LIGHT EMITTING DEVICE PACKAGE AND ULTRAVIOLET LAMP HAVING THE SAME

(75) Inventors: Gun Kyo Lee, Seoul (KR); Su Jung Jung, Seoul (KR); Yu Dong Kim, Seoul (KR); Byung Mok Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/469,361

(22) Filed: May 11, 2012

(65) Prior Publication Data
US 2012/0286319 A1    Nov. 15, 2012

(30) Foreign Application Priority Data

May 13, 2011 (KR) .................. 10-2011-0045378
May 13, 2011 (KR) .................. 10-2011-0045379

(51) Int. Cl.
*H01L 33/64* (2010.01)
*H01L 25/16* (2006.01)
*H01L 33/48* (2010.01)

(52) U.S. Cl.
CPC .......... *H01L 33/642* (2013.01); *H01L 25/167* (2013.01); *H01L 33/486* (2013.01); *H01L 2224/48091* (2013.01)

(58) Field of Classification Search
CPC .................................................. H01L 33/642
USPC .......... 257/79–103, 706, 678, 723, E23.101; 438/26, 116, 122
See application file for complete search history.

(56) References Cited

U.S. PATENT DOCUMENTS

| | | | | |
|---|---|---|---|---|
| 4,326,214 A | * | 4/1982 | Trueblood | .................... 257/681 |
| 2004/0079957 A1 | | 4/2004 | Andrews et al. | |
| 2004/0130037 A1 | * | 7/2004 | Mishra | ................ H01L 21/8252 257/778 |
| 2007/0029564 A1 | * | 2/2007 | Han | ...................... H01L 25/167 257/98 |
| 2008/0023721 A1 | * | 1/2008 | Lee | ......................... H01L 33/52 257/99 |
| 2009/0008671 A1 | * | 1/2009 | Liu | ....................... H01L 33/483 257/99 |
| 2010/0193822 A1 | * | 8/2010 | Inobe et al. | .................... 257/98 |

(Continued)

FOREIGN PATENT DOCUMENTS

CN  1871710     3/2011
EP  2 246 913   11/2010

(Continued)

OTHER PUBLICATIONS

European Search Report for Application EP 12 16 7228 dated Oct. 23, 2015.

(Continued)

*Primary Examiner* — Matthew C Landau
*Assistant Examiner* — Mark Hatzilambrou
(74) *Attorney, Agent, or Firm* — KED & Associates, LLP

(57) ABSTRACT

Provided is a light emitting device package. The light emitting device package comprises a body, a heat diffusing member, a light emitting diode (LED), and a buffer layer. A cavity with an opened topside is formed in the body. The heat dissipation member is disposed between a bottom surface of the cavity and a lower surface of the body. The LED is disposed on one of an electrode disposed on the bottom surface of the cavity. The buffer layer is disposed between the heat dissipation member and a pad and has a thickness thinner than a thickness of the heat dissipation member.

20 Claims, 11 Drawing Sheets

(56) References Cited

U.S. PATENT DOCUMENTS

| | | |
|---|---|---|
| 2010/0270579 A1 | 10/2010 | Jo |
| 2011/0089465 A1* | 4/2011 | Lin et al. .................. 257/99 |
| 2011/0096560 A1* | 4/2011 | Ryu et al. ................ 362/510 |
| 2011/0175511 A1* | 7/2011 | Lai ..................... H01L 33/642 |
| | | 313/46 |

FOREIGN PATENT DOCUMENTS

| | | | |
|---|---|---|---|
| JP | 2006-093565 | 4/2006 | |
| JP | 2006-216764 | 8/2006 | |
| JP | 2006-229151 | 8/2006 | |
| JP | 2007-123482 | 5/2007 | |
| JP | 2008-041968 | 2/2008 | |
| JP | 2008-085296 | 4/2008 | |
| JP | 2008-109079 | 5/2008 | |
| JP | 2009-071013 | 4/2009 | |
| JP | 2009-224751 | 10/2009 | |
| KR | 10-2009-0104577 A * | 10/2009 | ............ H01L 33/00 |
| KR | 2009-0104577 | 10/2009 | |
| WO | WO 2007/058438 | 5/2007 | |
| WO | WO 2008/038574 | 4/2008 | |

OTHER PUBLICATIONS

Japanese Office Action for Application 2012-105795 dated Jan. 19, 2016 (full Japanese text).
Chinese Office Action for Application 201210148995.7 dated Dec. 28, 2015 (full Chinese text).
Japanese Office Action dated Oct. 1, 2018 issued in Application No. 2018-112131.

* cited by examiner

LIGHT EMITTING DEVICE PACKAGE AND ULTRAVIOLET LAMP HAVING THE SAME

CROSS-REFERENCE TO RELATED APPLICATIONS

The present application claims priority under 35 U.S.C. § 119(a) of Korean Patent Application No. 10-2011-0045378 and No. 10-2011-0045379 filed on May 13, 2011, which is hereby incorporated by reference in its entirety.

BACKGROUND

The present disclosure relates to a light emitting device package and an ultraviolet lamp having the light emitting device package.

Light emitting diodes (LEDs) may be used as light sources and formed of a compound semiconductor material such as a GaAs-containing material, an AlGaAs-containing material, a GaN-containing material, an InGaN-containing material, and an InGaAlP-containing material.

Light emitting device packages capable of emitting light of various colors can be fabricated by packaging such LEDs. Light emitting device packages are used as light sources for a variety of devices such as lighting display devices, character display devices, and image display devices.

Particularly, ultraviolet (UV) LEDs can emit light having a wavelength of 245 nm to 405 nm. For example, short-wavelength light emitted from UV LEDs may be used for sterilization or purification, and long-wavelength light emitted from UV LEDs may be used for light exposing or UV curing.

However, while emitting light, UV LEDs generate heat that causes errors and lowers reliability. Such heat can be dissipated by increasing the size of packages of UV LEDs. However, in this case, it is difficult to provide highly integrated, economical LED packages.

SUMMARY

Embodiments provide a light emitting device package having an improved structure.

Embodiments provide a light emitting device package in which a heat dissipation member is disposed between a body and a light emitting diode.

Embodiments provide a light emitting device package in which a buffer layer is disposed between a body and a heat dissipation member.

Embodiments provide an ultraviolet light emitting device package including an ultraviolet light emitting diode and a protection device for the ultraviolet light emitting diode.

Embodiments provide a light emitting device package including a cavity in which a plurality of sub cavities are formed therein.

Embodiments provide a light emitting device package in which a protection device is disposed in at least one of sub cavities to protect an ultraviolet light emitting diode.

Embodiments provide a reliable ultraviolet lamp including a light emitting device package.

In one embodiment, a light emitting device package comprises: a body comprising a cavity with an opened topside, the body comprising a ceramic material; a heat dissipation member between a bottom surface of the cavity and a lower surface of the body; a plurality of electrodes on the bottom surface of the cavity; a plurality of pads disposed on the lower surface of the body and electrically connected to at least one of the electrodes; a light emitting diode (LED) disposed on one of the electrodes disposed on the bottom surface of the cavity, the light emitting diode being electrically connected to at least one of the electrodes; and a buffer layer disposed between the heat dissipation member and at least one of the pads and having a thickness thinner than a thickness of the heat dissipation member.

In another embodiment, a light emitting device package comprises: a body comprising a cavity with an opened topside, the body comprising a ceramic material; a plurality of electrodes comprising a first electrode disposed in a first region of a bottom surface of the cavity, and at least one second electrode disposed on the bottom surface of the cavity and spaced apart from the first electrode; a plurality of pads comprising a first pad disposed on a lower surface of the body and corresponding to the first electrode, and a second pad electrically connected to the first pad; a light emitting diode disposed on the first electrode disposed on the bottom surface of the cavity, the light emitting diode being electrically connected to at least one of the electrodes; a heat dissipation member disposed in the body between the first electrode and the first pad; and a buffer layer disposed between the heat dissipation member and at least one of the pads, wherein a surface of the heat dissipation member has a roughness.

In further another embodiment, an ultraviolet lamp comprises: a light emitting device package: and a module board on which the light emitting device package is disposed, wherein the light emitting device package comprises: a body comprising a cavity with an opened topside, the body containing a ceramic material; a heat dissipation member disposed between a bottom surface of the cavity and a lower surface of the body; a plurality of electrodes on the bottom surface of the cavity; a plurality of pads disposed on the lower surface of the body and electrically connected to at least one of the electrodes; a light emitting diode (LED) disposed on one of the electrodes disposed on the bottom surface of the cavity, the light emitting diode being electrically connected to the electrodes; and a buffer layer disposed between the heat dissipation member and at least one of the pads and having a thickness thinner than a thickness of the heat dissipation member.

The details of one or more embodiments are set forth in the accompanying drawings and the description below. Other features will be apparent from the description and drawings, and from the claims.

DETAILED DESCRIPTION OF THE EMBODIMENTS

Figure 1:
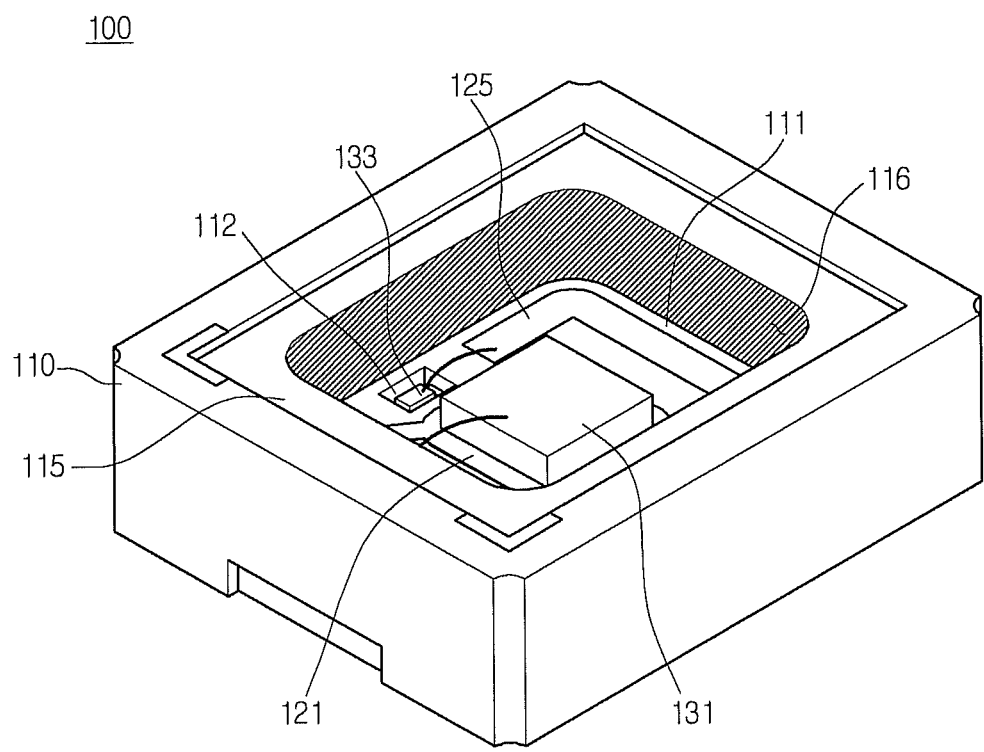
FIG. 1 is a perspective view illustrating a light emitting device package according to a first embodiment.

Embodiments will now be described in detail with reference to the accompanying drawings in such a manner that the technical idea of the present disclosure may easily be carried out by a person of ordinary skill in the art. However, the scope and spirit of the present disclosure are not limited to the embodiments but can be realized in different forms.

In the specification, when it is described that one comprises (or includes or has) some elements, it should be understood that it may comprise (or include or have) only those elements, or it may comprise (or include or have) other elements as well as those elements if there is no specific limitation.

In the drawings, regions not relating to descriptions are omitted for clarity in description, and layers and regions are exaggerated for clarity. Throughout the specification, like reference numerals denote like elements.

It will be understood that when a layer, a film, a region, or a plate is referred to as being 'on' another layer, film, region, or plate, it can be directly on the other layer, film, region, or plate, or intervening layers, films, regions, or plates may also be present. However, if a layer, a film, a region, or a plate is referred to as being 'directly on' another layer, film, region, or plate, there is not intervening layer, film, region, or plate.

Hereinafter, a light emitting device package will be described with reference to FIGS. 1 to 6 according to a first embodiment.

Figure 2:
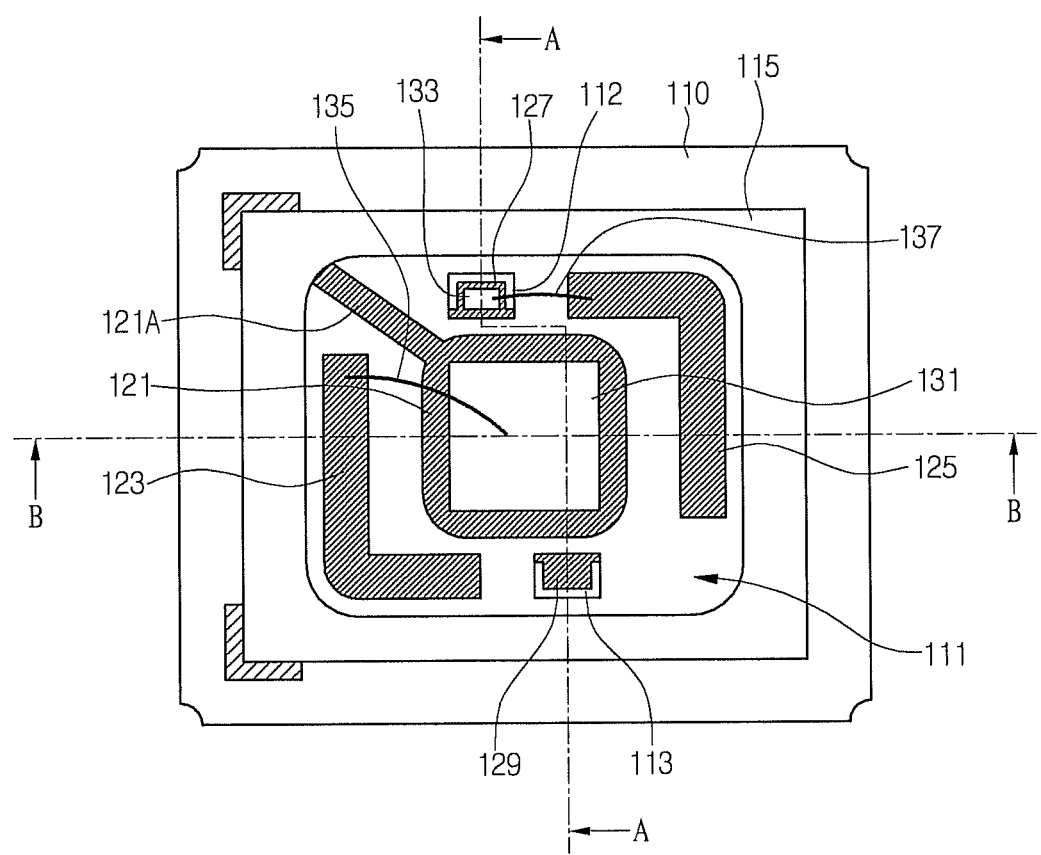
FIG. 2 is a plan view illustrating the light emitting device package of FIG. 1.
Figure 3:
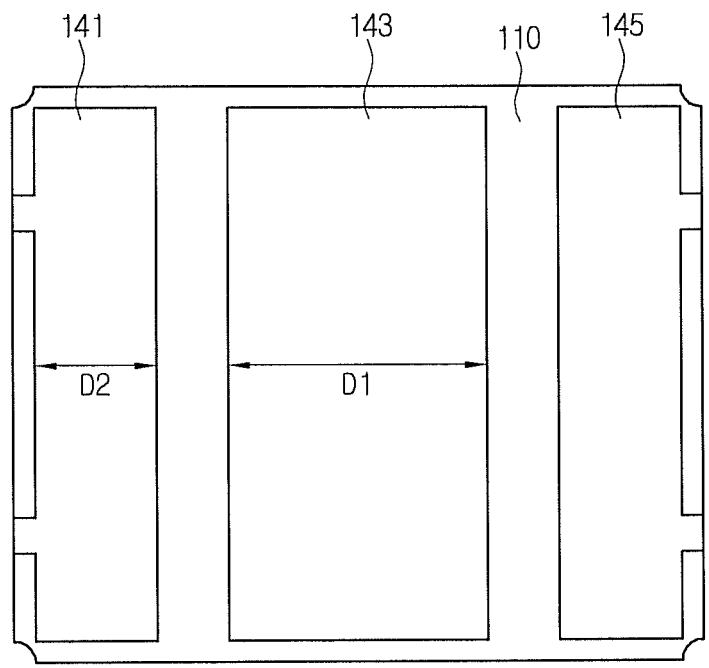
FIG. 3 is a bottom view illustrating the light emitting device package of FIG. 1.
Figure 4:
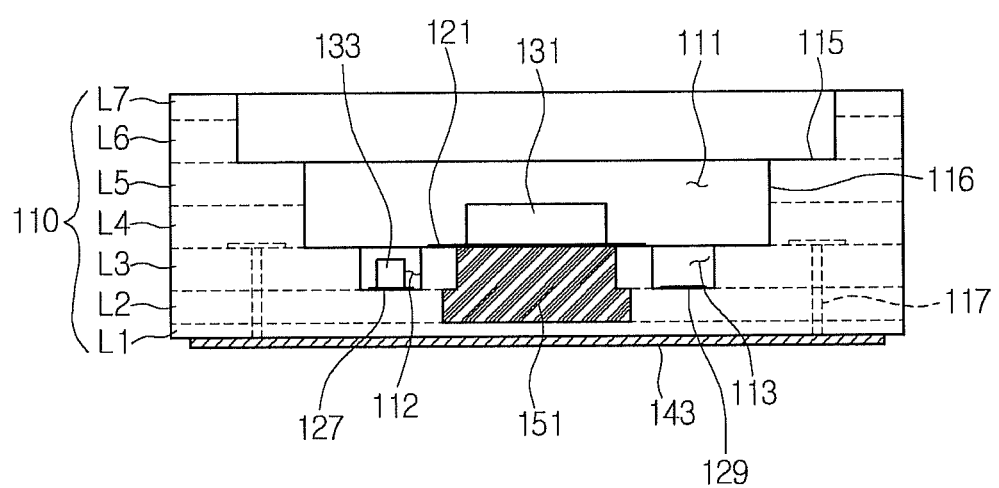
FIG. 4 is a sectional view taken line A-A of FIG. 2.
Figure 5:
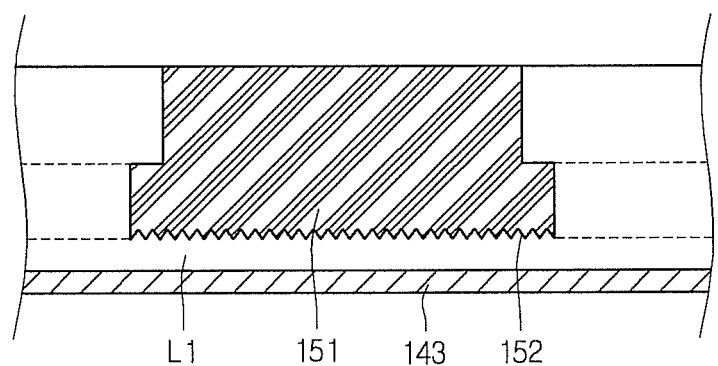
FIG. 5 is a partially enlarged view for illustrating the roughness of a heat dissipation member illustrated in FIG. 4.

FIG. 1 is a perspective view illustrating a light emitting device package 100 according to a first embodiment; FIG. 2 is a plan view illustrating the light emitting device package 100 of FIG. 1; FIG. 3 is a bottom view illustrating the light emitting device package 100 of FIG. 1; FIG. 4 is a sectional view taken line A-A of FIG. 2; FIG. 5 is a partially enlarged view for illustrating the roughness of a heat dissipation member illustrated in FIG. 4; and FIG. 6 is a sectional view taken along line B-B of FIG. 2.

Referring to FIGS. 1 to 6, the light emitting device package 100 includes: a body 110 having a cavity 111 with an opened topside; a plurality of sub cavities 112 and 113 (first and second sub cavities 112 and 113) disposed in the cavity 111; first to third electrodes 121, 123, and 125 disposed in the cavity 111 of the body 110; a light emitting diode (LED) 131 disposed on the first electrode 121; and a protection device 133 disposed in one of the sub cavities 112 and 113.

Figure 6:
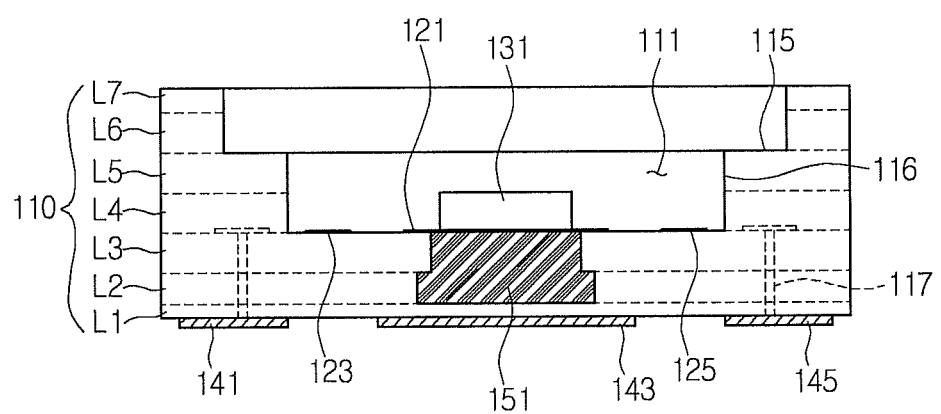
FIG. 6 is a sectional view taken along line B-B of FIG. 2.

As shown in FIGS. 4 and 6, the body 110 may be formed by stacking a plurality of insulation layers L1 to L7 (first to seventh insulation layers L1 to L7). The insulation layers L1 to L7 are stacked in the thickness direction of the LED 131. The insulation layers L1 to L7 include a ceramic material. The ceramic material includes a low temperature co-fired ceramic material or a high temperature co-fired ceramic material. The body 110 may include a metal pattern and connection members 117. The metal pattern may be formed on at least one of the top and lower surfaces of one of the insulation layers L1 to L7, and the insulation layers L1 to L7 may vertically penetrate the body 110 for selective connection with the metal pattern. The connection members 117 include vias or via holes. However, the connection members 117 are not limited to the vias or via holes. In another example, the insulation layers L1 to L7 may include insulation members formed of a nitride or oxide. Specifically, the insulation layers L1 to L7 may include insulation members formed of a metal nitride having a thermal conductivity greater than those of oxides or nitrides. For example, the body 110 may be formed of $Si_xO_y$, $Si_3N_4$, $Si_xN_y$, $SiO_xN_y$, $Al_2O_3$, or AlN. In another example, the body 110 may be formed of a metal nitride having a thermal conductivity of 140 W/mK or greater.

The insulation layers L1 to L7 of the body 110 may have the same thickness, or at least one of the insulation layers L1 to L7 may have a different thickness. However, the current embodiment is not limited thereto. The insulation layers L1 to L7 of the body 110 are individual layers stacked through a manufacturing process. The insulation layers L1 to L7 may be formed in one piece by a firing process. In FIGS. 4 and 6, the body 110 includes seven insulation layers L1 to L7. However, the body 110 may include three or more insulation layers. The current embodiment is not limited thereto.

The body 110 includes a stepped structure 115. The stepped structure 115 is formed along the periphery of the top surface of the body 110. The stepped structure 115 is located between the top surface of the body 110 and the cavity 111, and the top surface of the stepped structure 115 is lower than the top surface of the body 110. The stepped structure 115 is located along the periphery of an upper portion of the cavity 111.

The cavity 111 is formed in an upper portion of the body 110 by downwardly recessing the top surface of the body 110. The topside of the cavity 111 is opened. Light emitted from the LED 131 may propagate through the topside of the cavity 111.

The cavity 111 may have a polygonal shape, and edges of the cavity 111 may be chamfered or rounded. In another example, the cavity 111 may have a circle shape. However, the cavity 111 is not limited thereto. The cavity 111 includes a region of the body 110 not including the stepped structure 115.

The width of a top portion of the cavity 111 may be equal to the width of a bottom portion of the cavity 111. A sidewall 116 of the cavity 111 may be perpendicular to the bottom of the cavity 111. In this case, since insulation layers (L1 to L7) having the same cavity width can be stacked, a process for manufacturing the light emitting device package 100 may be easily carried out. In another example, the width of the lower portion of the cavity 111 may be different from the width of an upper portion of the cavity 111. In this case, a molding member may be firmly molded in the cavity 111 to suppress permeation of moisture.

A metal layer may be selectively disposed on the sidewall 116 of the cavity 111. The metal layer may be formed by coating the sidewall 116 with a metal having a reflectance of 50% or greater or a metal having a high thermal conductivity. The metal layer may increase light extraction efficiency and heat dissipation efficiency of the cavity 111. The metal layer may be formed on the sidewall 116 partially or entirely. However, metal layer is not limited thereto. If the body 110 is formed of a material such as AlN having a high thermal conductivity, the metal layer may not be formed. The metal layer may also be formed on the bottom surface of the cavity 111 to improve light reflection efficiency of the bottom surface of the cavity 111. In this case, the metal layer may be located on the bottom surface of the cavity 111 in a manner such that the metal layer is not electrically connected to an electrode disposed in the cavity 111. The metal layer may be a reflection layer having a reflectance of 80%, or greater.

The sub cavities 112 and 113 are disposed in the cavity 111 as shown in FIGS. 1 and 2. The distance between the sub cavities 112 and 113 may be greater than the width of the LED 131. The sub cavities 112 and 113 may be deeper than the cavity 111, and the depths of the sub cavities 112 and 113 may be equal to or greater than at least the thickness of the protection device 133. The sub cavities 112 and 113 may have predetermined depths so that the protection device 133 cannot protrude from the bottom surface of the cavity 111. The depths of the sub cavities 112 and 113 may be about 150 μm±10 μm. However, the depths of the sub cavities 112 and 113 are not limited thereto. The depths of the sub cavities 112 and 113 may be a range of ½ to ¼ of the depth of the cavity 111. In this case, light emitted from the LED 131 may be less absorbed. Thus, light extraction efficiency may not be decreased, and the directional angle of light may not be distorted. The protection device 133 includes a Zener diode.

The first sub cavity 112 is disposed between a first side of the LED 131 and a side of the cavity 111, and the second sub cavity 113 is disposed between a second side of the LED 131 and the other side of the cavity 111. The first and second sides of the LED 131 may be opposite sides. The first and second sub cavities 112 and 113 may be disposed on an oblique line passing through the center of the LED 131 or at symmetric positions with respect to the center of the LED 131. However, the position of the first and second sub cavities 112 and 113 are not limited thereto.

The second sub cavity 113 may be a dummy cavity in which no protection device is disposed. The first and second sub cavities 112 and 113 are symmetric with respect to the LED 131, and owing to this, heat generated from the LED 131 can be uniformly distributed in the cavity 111. Thus, the light emitting device package 100 can be thermally stable. In another example, both the first and second sub cavities 112 and 113 may be dummy cavities.

First to fifth electrodes 121, 123, 125, 127, and 129 are disposed in the cavity 111 and the sub cavities 112 and 113 so as to selectively supply electricity to the LED 131 and the protection device 133. The electrodes 121, 123, 125, 127, and 129 may selectively include a metal layer formed of a metal such as platinum (Pt), titanium (Ti), copper (Cu), nickel (Ni), gold (Au), tantalum (Ta), or aluminum (Al). At least one of the electrodes 121, 123, 125, 127, and 129 may have a single-layer or multi-layer structure. The uppermost layer of the multi-layer structure may include gold (Au) having a bonding property and the lowermost layer of the multi-layer structure may include a metal having an adhesive property. An intermediate layer of the multi-layer structure may include a metal such as platinum (Pt), nickel (Ni), or copper (Cu). However, the electrodes 121, 123, 125, 127, and 129 are not limited to the above-mentioned structure.

The cavity 111 accommodates: the first electrode 121 on which the LED 131 is disposed; and the second and third electrodes 123 and 125 spaced apart from the first electrode 121. The first electrode 121 is disposed in a center region of the cavity 111, and the second and third electrodes 123 and 125 are disposed at both sides of the first electrode 121. The second and third electrodes 123 and 125 may be disposed at symmetric positions with respect to the center of the LED 131, and the topsides of the second and third electrodes 123 and 125 may be opened.

The second electrode 123 is disposed on the bottom surface of the cavity 111 at a position close to a first corner region of the cavity 111, and the third electrode 125 is disposed on the bottom surface of the cavity 111 at a position close to a second corner region of the cavity 111. The first and second corner regions are diagonally arranged.

The fourth electrode 127 is disposed in the first sub cavity 112, and the fifth electrode 129 is disposed in the second sub cavity 113. The second and third electrodes 123 and 125 may be negative electrodes, and the first, fourth, and fifth electrodes 121, 127, and 129 may be positive electrodes. The polarities of the electrodes 121, 123, 125, 127, and 129 are not limited thereto. The polarities of the electrodes 121, 123, 125, 127, and 129 may be changed according to electrode patterns or connection methods.

If a pad or a conductive substrate is not disposed under the LED 131, the first electrode 121 may be used as a nonpolar metal layer or heat-dissipating plate. Each of the electrodes 121, 123, 125, 127, and 129 may be a metal layer. However, the electrodes 121, 123, 125, 127, and 129 are not limited thereto.

A portion 121A of the first electrode 121 may extend to an inside region of the body 110 and may be electrically connected to the lower surface of the body 110 through the connection member 117.

As shown in FIGS. 3 to 6, a plurality of pads 141, 143, and 145 are disposed on the lower surface of the body 110. The pads 141, 143, and 145 include at least three pads. For example, the pads 141, 143, and 145 include first, second, and third pads 141, 143, and 145. The first pad 141 is disposed at a side of the lower surface of the body 110, the second pad 143 is disposed at a center region of the lower surface of the body 110, and the third pad 145 is disposed at the other side of the lower surface of the body 110. The second pad 143 is disposed between the first pad 141 and the third pad 145 and has a width D1 greater than a width D2 of the first pad 141 or the third pad 145 (D1>D2). The length of each of the pads 141, 143, and 145 may be equal to or greater than 70% of the length of the lower surface of the body 110. However, the lengths of the pads 141, 143, and 145 are not limited thereto.

At least two of the pads 141, 143, and 145 have a polarity. For example, the first and second pads 141 and 143 may be connected to a positive power terminal, and the third pad 145 may be connected to a negative power terminal. Since two pads 141 and 143 are connected to the positive power terminal, a current path can be dispersed. Owing to this, heat can be dispersed, and electrical reliability can be ensured.

As shown in FIGS. 4 to 6, the connection members 117 are disposed in the body 110. The electrodes 121, 123, 125, 127, and 129 are selectively connected to the pads 141, 143, and 145 through the connection members 117. For example, the first, fourth, and fifth electrodes 121, 127, and 129 may be connected to the first and second pads 141 and 143 through at least one connection member 117, and the second and third electrodes 123 and 125 may be connected to the third pad 145 through at least one other connection member 117. However, the current embodiment is not limited thereto.

As shown in FIGS. 4 to 6, a heat dissipation member 151 is disposed in the body 110. The main body 151 may be disposed under the LED 131. That is, the heat dissipation member 151 may be disposed under the first electrode 121. The thickness of the heat dissipation member 151 may be thinner than a thickness defined from the bottom surface of the cavity ill to the lower surface of the body 110. For example, the heat dissipation member 151 may have a thickness of 150 μm or greater.

The heat dissipation member 151 may be formed of a metal or a metal alloy. The metal alloy includes a metal having a high thermal conductivity such as copper (Cu). For example, the heat dissipation member 151 may include CuW.

A lower portion of the heat dissipation member 151 may be wider than an upper portion of the heat dissipation member 151. The heat dissipation member 151 may have a circular or polygonal shape when viewed from the topside. The top surface area of the heat dissipation member 151 may be greater than at least the lower surface area of the LED 131. However, the heat dissipation member 151 is not limited thereto.

The first insulation layer L1 is disposed below the heat dissipation member 151 and is used as a buffer layer. That is, the first insulation layer L1 is disposed between the heat dissipation member 151 and the pads 141, 143, and 145 as a buffer layer for a rough surface of the heat dissipation member 151 so that the surface of the body 110 making contact with the second pad 143 can be flat for enhancing a solder bonding force. A roughness 152 formed on a lower surface of the heat dissipation member 151 may be 10 μm or less in root mean square (RMS). For example, the roughness 152 of the heat dissipation member 151 may be 5 μm or less. The top surface of the first insulation layer L1 is rough due to the roughness 152 of the heat dissipation member 151. Thus, the top surface of the first insulation layer L1 may be rougher than the lower surface of the first insulation layer L1.

The first electrode 121 is disposed on the top surface of the heat dissipation member 151, and a bonding layer is disposed between the first electrode 121 and the LED 131. The bonding layer may have a predetermined thickness for relieving a roughness of the heat dissipation member 151. For example, the bonding layer may have a thickness of about 5 μm. The bonding layer may include a conductive bonding material such as AuSn.

The LED 131 may be disposed in the cavity 111. The cavity 111 may be an ultraviolet LED capable of emitting light having a wavelength of 245 nm to 405 nm. That is, an LED capable of emitting short-wavelength ultraviolet light having a wavelength of about 280 nm or an LED capable of emitting long-wavelength ultraviolet light having a wavelength of 365 nm or 385 nm may be used as the LED 131.

As shown in FIG. 2, the LED 131 may be bonded to the first electrode 121 using a conductive adhesive and connected to the second electrode 123 through a first connection member 135. The LED 131 may be electrically connected to the first electrode 121 and the second electrode 123. The LED 131 may be mounted using a wire bonding method, a die bonding method, or a flip bonding method according to the type of a chip and the positions of electrodes of the chip. The protection device 133 may be bonded to the fourth electrode 127 and may be connected to the third electrode 125 through a second connection member 137 for electric connection with the third and fourth electrodes 125 and 127. The first and second connection members 135 and 137 include wires.

The LED 131 may selectively include a semiconductor light emitting device fabricated using a semiconductor material such as a group III compound semiconductor and a group V compound semiconductor. For example, the LED 131 may selectively include a semiconductor light emitting device fabricated using AlInGaN, InGaN, GaN, GaAs, InGaP, AlInGaP, InP, or InGaAs.

A molding member may be disposed in at least one of the cavity 111 and the sub cavities 112 and 113. The molding member may include a transparent resin material such as silicone or epoxy.

Figure 7:
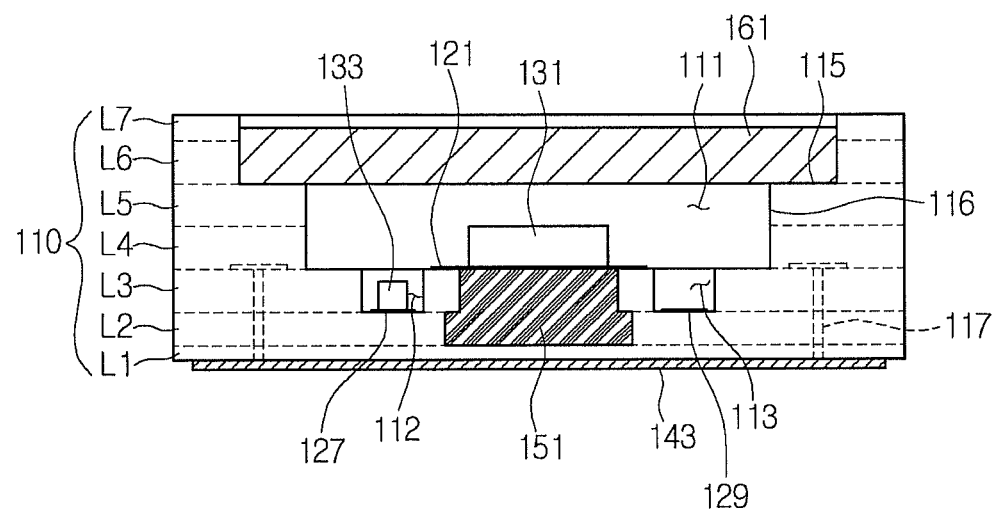
FIGS. 7 to 9 are views illustrating modified versions of the light emitting device package illustrated in FIG. 4.

FIG. 7 illustrates an example in which a glass film 161 is disposed on the light emitting device package 100.

Referring to FIG. 7, the glass film 161 is disposed on the body 110 to cover the cavity 111. The glass film 161 may include a glass-containing material, and the top surface of the glass film 161 may be flat.

The glass film 161 may be formed of a transparent material such as LiF, $MgF_2$, $CaF_2$, $BaF_2$, $Al_2O_3$, $SiO_2$, or optical glass (N-BK7). If the glass film 161 is formed of $SiO_2$ by using crystal quartz or ultraviolet fused silica. The glass film 161 may be a low iron glass film.

The glass film 161 is disposed on the stepped structure 115 formed between the upper sixth and seventh insulation layers L6 and L7 and the lower fifth insulation layer L5. The glass film 161 may have a circular or polygonal shape. The glass film 161 may be connected to the body 110 using fastening members and/or an adhesive. An additional structure may be formed on the stepped structure 115 for supporting and fixing the glass film 161. However, the scope and spirit of the present disclosure are not limited thereto.

The thickness of the glass film 161 may be smaller than the thickness of the upper sixth and seventh insulation layers L6 and L7. However, the glass film 161 is not limited thereto. The thickness of the glass film 161 may be equal to or less than ½ of the width difference between the sixth insulation layer L6 and the fifth insulation layer L5.

An adhesive (not shown) may be applied between the glass film 161 and the top surface of the stepped structure 115. The adhesive may be a silver (Ag) paste, an ultraviolet adhesive, lead (Pb)-free low-temperature glass adhesive, an acrylic adhesive, or a ceramic adhesive.

A molding member may be disposed in at least one of the cavity 111 and the sub cavities 112 and 113. An inert gas may be filled in the cavity 111 instead of filling the cavity 111 with a molding member. The LED 131 can be protected from environments such as moisture and oxygen by filling the cavity 111 with an inert gas such as nitrogen. In this case, a molding member may be filled in the sub cavities 112 and 113. However, the scope and spirit of the present disclosure are not limited thereto.

The heat dissipation member 151 is disposed in the body 110 to improve heat dissipation efficiency, and thus the same package structure can be used regardless of the wavelength of light emitted from the LED 131. That is, the same package structure can be used for various LEDs.

Figure 8:
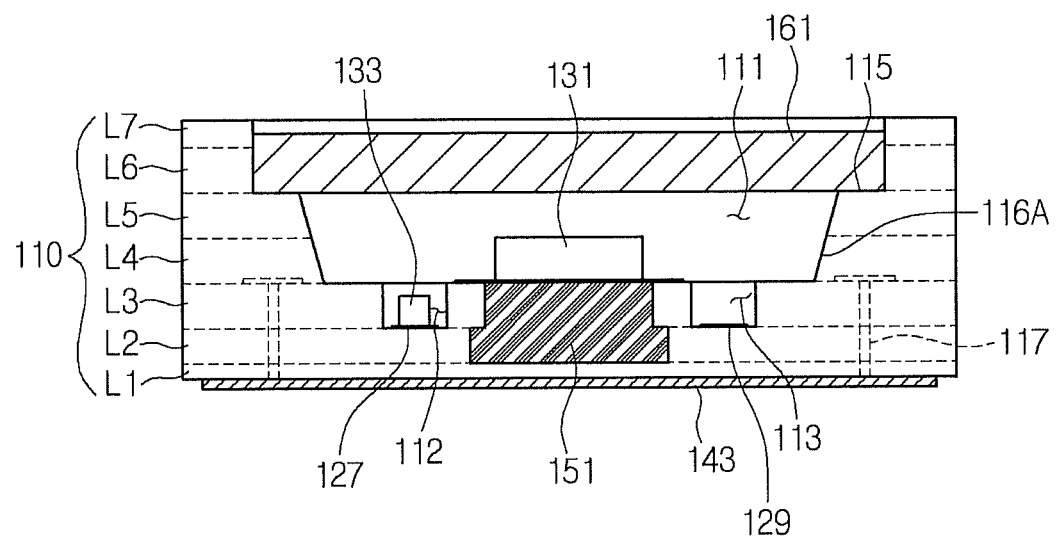

FIG. 8 illustrates a modified version of the light emitting device package illustrated in FIG. 4.

Referring to FIG. 8, in the body 110, a sidewall 116A of the cavity 111 is sloped from the bottom surface of the cavity 111. That is, the width of an upper portion of the cavity 111 is greater than the width of a lower portion of the cavity 111. For example, the width of the cavity 111 may increase as it goes upward. Since the sidewall 116A of the cavity 111 is sloped between the glass film 161 and the bottom surface of the cavity 111, light extraction efficiency may be increased.

Figure 9:
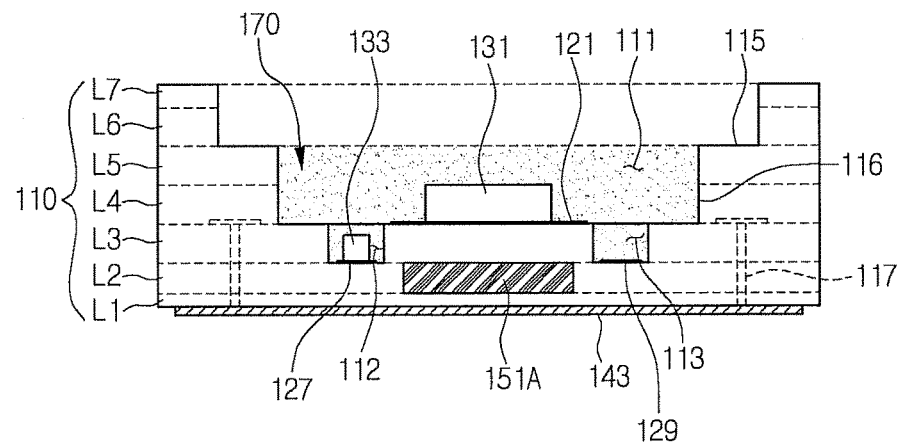

FIG. 9 illustrates a modified version of the light emitting device package illustrated in FIG. 4.

Referring to FIG. 9, a molding member 170 is disposed in the cavity 111 of the light emitting device package. The cavity 111 and the sub cavities 112 and 113 may be filled with the molding member 170. Alternatively, the sub cavities 112 and 113 may be filled with the molding member 170, and the cavity 111 may be left empty. The molding member 170 may include a transparent resin material such as silicone or epoxy.

A glass film may be disposed on the cavity 111 as illustrated in FIG. 7. However, the current modified version is not limited thereto. In addition, a molding member filled in the sub cavities 112 and 113 may be different from a molding member filled in the cavity 111.

A heat dissipation member 151A may be spaced apart from the bottom surface of the cavity 111. The third insulation layer L3 may be disposed between the first electrode 121 and the top surface of the heat dissipation member 151A. The third insulation layer L3 may function as an upper buffer layer for a top surface roughness of the heat dissipation member 151A.

Figure 10:
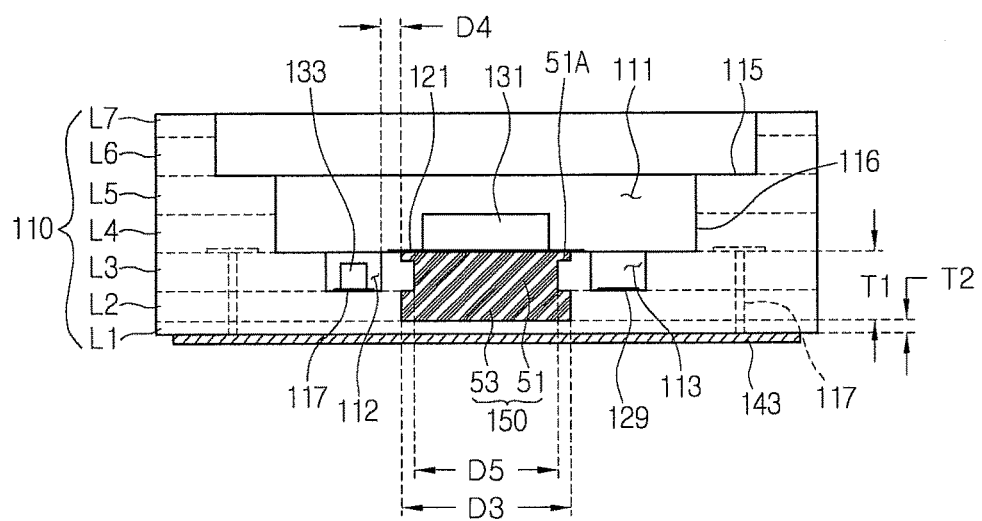
FIG. 10 is a sectional view taken along line A-A of FIG. 2 for illustrating a light emitting device package according to a second embodiment.
Figure 11:
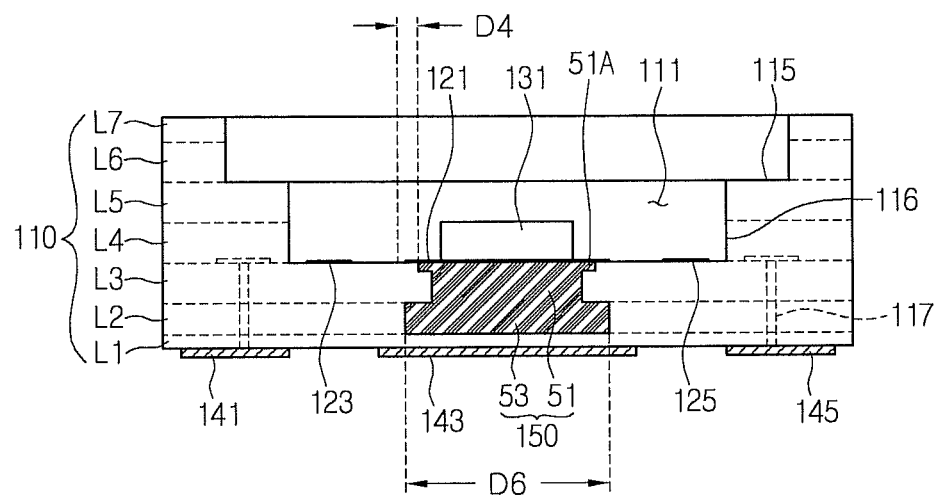
FIG. 11 is a sectional view taken along line B-B of FIG. 2 for illustrating a light emitting device package according to the second embodiment.

FIGS. 10 and 11 illustrate a second embodiment. FIG. 10 is a sectional view taken along line A-A of FIG. 2, and FIG. 11 is a sectional view taken along line B-B of FIG. 2. In the following description of the second embodiment, descriptions of the same parts as those of the first embodiment will not be repeated.

Referring to FIGS. 10 to 11, a light emitting device package includes: a body 110 having a cavity 111; a plurality of sub cavities 112 and 113 (first and second sub cavities) disposed in the cavity 111; first to third electrodes 121, 123, and 125 disposed in the cavity 111 of the body 110; an LED 131 disposed on the first electrode 121; and a protection device 133 disposed in one of the sub cavities 112 and 113.

The body 110 may have a stacked structure constituted by a plurality of insulation layers L1 to L7 (first to seventh insulation layers L1 to L7). The insulation layers L1 to L7 include a ceramic material. The ceramic material includes a low temperature co-fired ceramic material or a high temperature co-fired ceramic material. For example, the body 110 may be formed of $Si_xO_y$, $Si_3N_4$, $Si_xN_y$, $SiO_xN_y$, $Al_2O_3$, or AlN. In another example, the body 110 may be formed of AlN or a metal nitride having a thermal conductivity of 140 W/mK or greater. The body 110 may have a stacked structure constituted by a plurality of ceramic layers.

A heat dissipation member 150 is disposed in the body 110. The heat dissipation member 150 is disposed between the LED 131 and the lower surface of the body 110. The heat dissipation member 150 may make contact with a lower side of the LED 131. That is, the heat dissipation member 150 may make contact with a lower side of the first electrode 121. The heat dissipation member 150 may have a thickness T1 smaller than a thickness (T1+T2) defined from the bottom surface of the cavity 111 to the lower surface of the body 110. The heat dissipation member 150 may have a thickness of 150 µm or greater. The heat dissipation member 150 may be formed of a metal or a metal alloy. The metal alloy includes a metal having a high thermal conductivity such as copper (Cu). For example, the heat dissipation member 150 may include CuW. The heat dissipation member 150 may be thicker than the first insulation layer L1. For example, the thickness of the heat dissipation member 150 may be three to eight times the thickness of the first insulation layer L1.

In a first section, a width D3 of a lower surface of the heat dissipation member 150 may be greater than that of a top surface of the heat dissipation member 150. The heat dissipation member 150 may have a circular or polygonal shape when viewed from the top. A width D6 of a lower surface of the heat dissipation member 150 measured in a second section may be greater than a width D3 of the lower surface of the heat dissipation member 150 measured in the first section. However, the widths D6 and D3 of the heat dissipation member 150 may be changed according to the positions of the sub cavities 112 and 113.

The top surface area of the heat dissipation member 150 may be greater than at least the lower surface area of the LED 131. However, the heat dissipation member 150 is not limited thereto.

The heat dissipation member 150 may include a first heat dissipation member 51 and a second heat dissipation member 53. The first heat dissipation member 51 may be disposed under the first electrode 121 and may be electrically connected to the LED 131. The second heat dissipation member 53 is disposed under the first heat dissipation member 51 and has a width wider than that of the first heat dissipation member 51. Heat generated from the LED 131 is conducted to the body 110 or the second heat dissipation member 53 through the first heat dissipation member 51. Heat conducted from the first heat dissipation member 51 to the second heat dissipation member 53 is conducted to the body 110 or a second pad 143 through the first insulation layer L1. For example, the lower surface area of the second heat dissipation member 53 may be smaller than the top surface area of the second pad 143 but greater than the top surface area of the first heat dissipation member 51.

The heat dissipation member 150 may be spaced apart from the first sub cavity 112 by a distance D4 of 0.3 mm or greater. If the distance D4 is less than 0.3 mm, the body 110 formed of a ceramic material may be cracked or broken. Thus, the distance D4 may be 0.3 mm or greater. In addition, owing to the distance D4, optical interference of light emitted from the LED 131 can be reduced.

A protrusion 51A protrudes from a top surface edge of the first heat dissipation member 51 of the heat dissipation member 150. The protrusion 51A protrudes from the first heat dissipation member 51 toward a lateral side of the cavity ill or the body 110. The contour of the protrusion 51A may be within the lower surface of the first electrode 121 but outside the lower surface of the LED 131 for improving heat dissipation efficiency. The protrusion 51A of the first heat dissipation member 51 may be spaced apart from the first sub cavity 112 or the second sub cavity 113 by a distance D4 of 0.3 mm or greater. Owing to the distance D4, breakage of the bottom side of the cavity 111 may be prevented at regions around the sub cavities 112 and 113.

The lateral side of the first heat dissipation member 51 has a groove or recess structure concave from the protrusion 51A and the second heat dissipation member 53. Owing to the recess structure, the first heat dissipation member 51 can be coupled more firmly.

The first insulation layer L1 is disposed under the heat dissipation member 150 and is used as a buffer layer. That is, the first insulation layer L1 is disposed between the heat dissipation member 150 and first to third pads 141, 143, and 145 as a buffer layer for the roughness of the heat dissipation member 150 so that the surface of the body 110 making contact with the second pad 143 can be flat for enhancing a solder bonding force. The first insulation layer L1 may have a thickness T2 of 50 µm or less. For example, the first insulation layer L1 may have a thickness T2 in the range from 20 µm to 50 µm. If the thickness T2 of the first insulation layer L1 is in the above-mentioned range, the surface roughness of the heat dissipation member 150 may be relieved by the first insulation layer L1.

A molding member may be disposed in at least one of the cavity 111 and the sub cavities 112 and 113. The molding member may include a transparent resin material such as silicone or epoxy.

Figure 12:
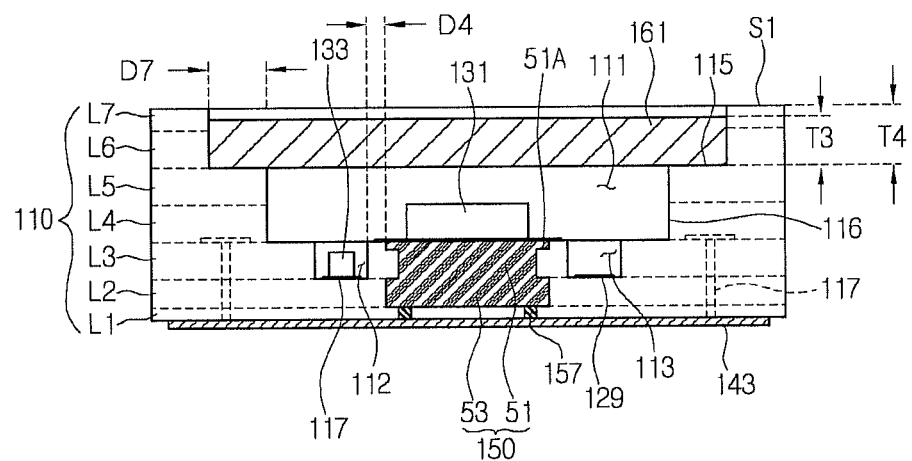
FIGS. 12 to 13 are views illustrating a modified version of the light emitting device package illustrated in FIG. 10.

FIG. 12 illustrates a modified version of the light emitting device package illustrated in FIG. 10.

Referring to FIG. 12, a glass film 161 is disposed on the body 110 to cover the cavity 111. The glass film 161 may be a glass-based film having a predetermined strength, and the top surface of the glass film 161 may be flat.

The glass film 161 may be formed of a transparent material such as LiF, $MgF_2$, $CaF_2$, $BaF_2$, $Al_2O_3$, $SiO_2$, or optical glass (N-BK7). If the glass film 161 is formed of $SiO_2$ by using crystal quartz or ultraviolet fused silica. The glass film 161 may be a low iron glass film.

A stepped structure 115 is formed by a width different D7 between the upper sixth and seventh insulation layers L6 and L7 and the lower fifth insulation layer L5, and the stepped structure 115 has a top surface lower than a top surface S1 of the body 110. The glass film 161 is placed on the stepped structure 115. The glass film 161 may have a circular or polygonal shape. The glass film 161 may be connected to the body 110 using fastening members and/or an adhesive. An additional structure may be formed on the stepped structure 115 for supporting and fixing the glass film 161. However, the scope and spirit of the present disclosure is not limited thereto.

The glass film 161 may have a thickness T3 smaller than a thickness T4 of the upper sixth and seventh insulation layers L6 and L7. However, the glass film 161 is not limited thereto. The thickness T3 of the glass film 161 may be equal to or less than ½ of the width difference between the sixth insulation layer L6 and the fifth insulation layer L5.

An adhesive (not shown) may be applied between the glass film 161 and the top surface of the stepped structure 115. For example, the adhesive may be a silver (Ag) paste, an ultraviolet adhesive, lead (Pb)-free low-temperature glass adhesive, an acrylic adhesive, or a ceramic adhesive.

A molding member may be disposed in at least one of the cavity 111 and the sub cavities 112 and 113. Alternatively, an inert gas may be filled in the cavity 111 instead of filling the cavity 111 with a molding member. The LED 131 can be protected from environments such as moisture and oxygen by filling the cavity 111 with an inert gas such as nitrogen. In this case, a molding member may be filled in the sub cavities 112 and 113. However, the scope and spirit of the present disclosure are not limited thereto.

The heat dissipation member 150 is disposed in the body 110 to improve heat dissipation efficiency, and thus the same package structure can be used regardless of the wavelength of light emitted from the LED 131. That is, the same package structure can be used for various LEDs.

A plurality of conductive vias 157 are formed in the first insulating layer L1 for electric connection between the heat dissipation member 150 and the second pad 143. In addition, the conductive vias 157 may function as heat dissipation passages for improving heat dissipation efficiency.

Figure 13:
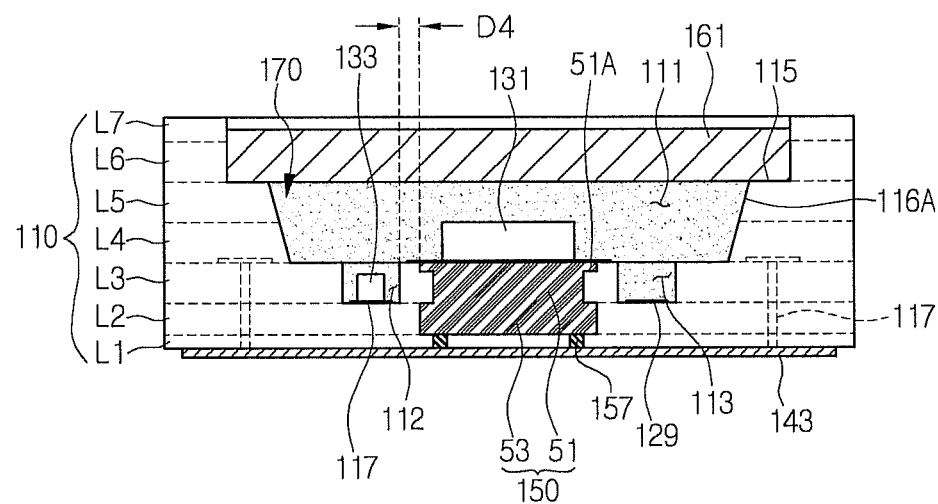

FIG. 13 is a sectional view illustrating a modified version of the light emitting device package illustrated in FIG. 10.

Referring to FIG. 13, in the body 110, a sidewall 116A of the cavity 111 is sloped. The width of an upper portion of the cavity 111 is wider than the width of a lower portion of the cavity 111. For example, the width of the cavity 111 may increase as it goes upward. Since the sidewall 116A of the cavity 111 is sloped, light extraction efficiency may be improved.

A molding member 170 is disposed in the cavity 111. The cavity 111 and the sub cavities 112 and 113 may be filled with the molding member 170. Alternatively, the sub cavities 112 and 113 may be filled with the molding member 170, and the cavity 111 may be left empty. The molding member 170 may include a transparent resin material such as silicone or epoxy. In addition, a molding member filled in the sub cavities 112 and 113 may be different from a molding member filled in the cavity 111.

A glass film 161 may be disposed on the cavity 111. However, the current modified version is not limited thereto.

Figure 14:
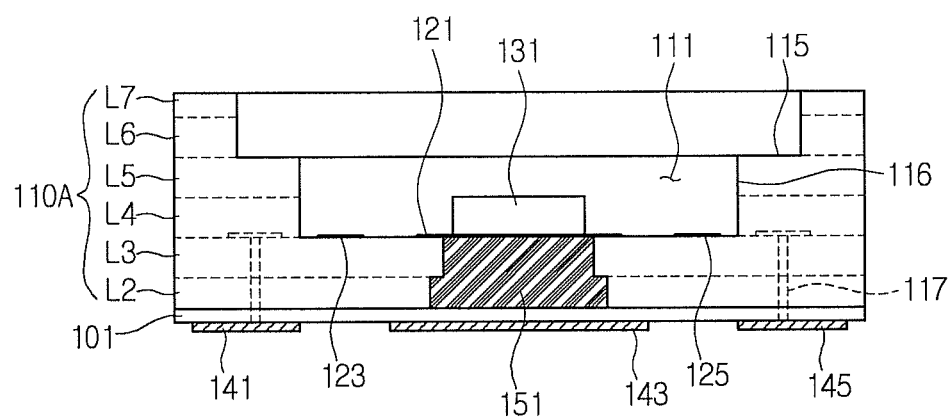
FIG. 14 is a view illustrating a light emitting device package according to a third embodiment.

FIG. 14 is a view illustrating a light emitting device package according to a third embodiment. In the following description of the third embodiment, descriptions of the same parts as those of the first embodiment will not be repeated.

Referring to FIG. 14, the light emitting device package includes: a body 110A having a cavity 111 with an opened topside; a plurality of electrodes 121, 123, and 125 (first to third electrodes 121, 123, and 125) disposed in the cavity 111; and an LED 131 disposed on the first electrode 121.

The body 110A may have a stacked structure constituted by a plurality of insulation layers L2 to L7 (second to seventh insulation layers L2 to L7). The insulation layers L2 to L7 are stacked in the thickness direction of the LED 131. The insulation layers L2 to L7 include a ceramic material. The ceramic material includes a low temperature co-fired ceramic material or a high temperature co-fired ceramic material. For example, the body 110A may be formed of $SiO_2$, $Si_xO_y$, $Si_3N_4$, $Si_xN_y$, $SiO_xN_y$, $Al_2O_3$, or AlN.

A buffer layer 101 is disposed on the lower surface of the body 110A. The buffer layer 101 may be formed of a ceramic material such as $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, or AlN. The buffer layer 101 may include a heat conductive material. For example, the buffer layer 101 may include one of carbon (C) materials such as carbon nanotubes (CNTs) that is different from the material used to form the body 110A.

The buffer layer 101 includes an insulation material such as polyacrylate resin, epoxy resin, phenolic resin, polyamides resin, polyimides rein, unsaturated polyesters resin, polyphenylene ether resin (PPE), polyphenilene oxide resin (PPO), polyphenylenesulfides resin, cyanate ester resin, benzocyclobutene (BOB), Polyamido-amine Dendrimers (PAMAM), polypropylene-imine, Dendrimers (PPI), and PAMAM-OS (organosilicon) (PAMAM is inside and organosilicon is outside). The buffer layer 101 may be formed of a resin including one or a combination of the listed materials.

At least one of compounds such as oxides, nitrides, fluorides, and sulfides having at least one of Al, Cr, Si, Ti, Zn, and Zr may be added to the buffer layer 101. The compound added to the buffer layer 101 may be a heat diffusing agent available in the form of powders, particles, fillers, or additives. In the following description, the compounded will be referred to a heat diffusing agent. The heat diffusing agent may be an insulation material or a conductive material and have a particle size of 1 Å to 100,000 Å. For high heat diffusing efficiency, the heat diffusing agent may have a particle size in the range from 1,000 Å to 50,000 Å. The heat diffusing agent may have a spherical or random particle shape. However, the particle shape of the heat diffusing agent is not limited thereto.

The heat diffusing agent includes a ceramic material. The ceramic material includes at least one of low temperature co-fired ceramic (LTCC), high temperature co-fired ceramic (HTCC), alumina, quartz, calcium zirconate, forsterite, SiC, graphite, fused silica, mullite, cordierite, zirconia, beryllia, and aluminum nitride.

The buffer layer 101 may be disposed between the body 110A and the pads 141, 143, and 145. The buffer layer 101 makes contact with the lower surface of a heat dissipation member 151 for relieving the surface roughness of the heat dissipation member 151 and dissipate heat conducted from the heat dissipation member 151.

The buffer layer 101 may have a top surface area equal to the lower surface area of the body 110A. However, the buffer layer 101 is not limited thereto.

Figure 15:
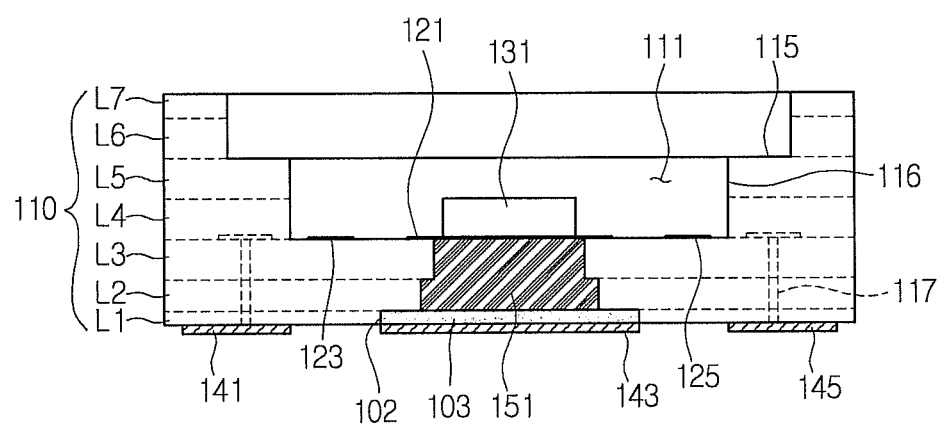
FIG. 15 is a view illustrating a light emitting device package according to a fourth embodiment.

FIG. 15 is a view illustrating a light emitting device package according to a fourth embodiment. In the following description of the fourth embodiment, descriptions of the same parts as those of the first embodiment will not be repeated.

Referring to FIG. 15, the light emitting device package includes: a heat dissipation member 151 disposed between the lower surface of a body 110 and a LED 131; and a buffer layer 103 disposed between the heat dissipation member 151 and a second pad 143.

The buffer layer 103 may be formed of a metal material different from that used to form the second pad 143. For example, the buffer layer 103 may include at least one of Ti, Cr, Ta, Cr/Au, Cr/Cu, Ti/Au, Ta/Cu, and Ta/Ti/Cu. The buffer layer 103 may be formed of a metal material and have a roughness smaller than that of the heat dissipation member 151. In another example, the buffer layer 103 may include a metal oxide. However, the buffer layer 103 is not limited thereto. The width of the buffer layer 103 may be wider than that of the lower surface of the heat dissipation member 151 but smaller than that of the top surface of the second pad 143.

The buffer layer 103 functions as a buffer layer for the surface roughness of the heat dissipation member 151 and as an electrically conductive layer. The buffer layer 103 is disposed in a recess 102 formed in the lower surface of the body 110. The buffer layer 103 makes contact with the lower surface of the heat dissipation member 151 and the top surface of the second pad 143. Therefore, heat conducted from the heat dissipation member 151 can be transferred to the second pad 143 through the buffer layer 103, and electricity can be input through the second pad 143, the buffer layer 103, and the heat dissipation member 151.

Figure 16:
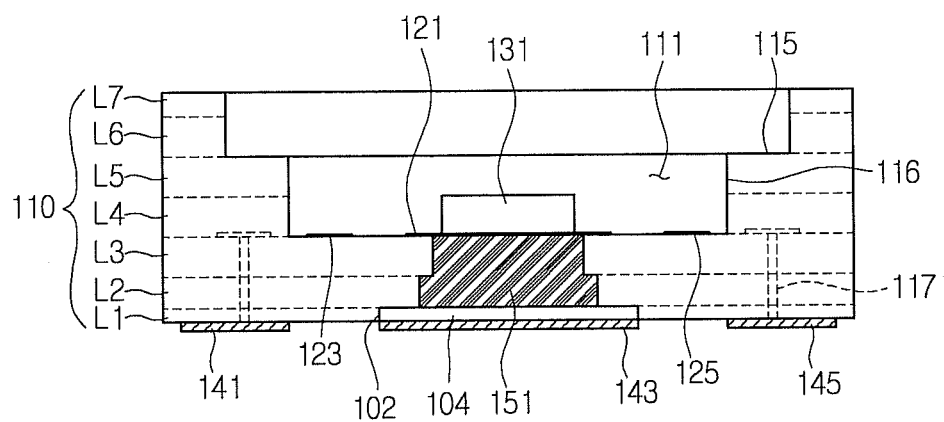
FIG. 16 is a view illustrating a light emitting device package according to a fifth embodiment.

FIG. 16 is a view illustrating a light emitting device package according to a fifth embodiment. In the following description of the fifth embodiment, descriptions of the same parts as those of the first embodiment will not be repeated.

Referring to FIG. 16, the light emitting device package includes: a heat dissipation member 151 disposed between the lower surface of a body 110 and a LED 131; and a buffer layer 104 disposed between the heat dissipation member 151 and a second pad 143.

The buffer layer 104 is disposed between the second pad 143 and the heat dissipation member 151 while making contact with the second pad 143 and the heat dissipation member 151. The buffer layer 104 may be formed of a material that is electrically insulative but thermally conductive. For example, the buffer layer 104 may be formed of a ceramic material.

The buffer layer 104 may be formed of a ceramic material such as $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, or AlN. The buffer layer 104 may include one of carbon (C) materials such as CNTs as a heat conductive material. At least one of compounds such as oxides, nitrides, fluorides, and sulfides having at least one of Al, Cr, Si, Ti, Zn, and Zr may be added to the buffer layer 104.

Therefore, the buffer layer 104 can be electrically insulative but thermally conductive. The buffer layer 104 is disposed in a recess 102 formed in the lower surface of the body 110. The buffer layer 103 makes contact with the lower surface of the heat dissipation member 151 and the top surface of the second pad 143. Therefore, heat conducted from the heat dissipation member 151 can be transferred to the second pad 143 through the buffer layer 104.

Figure 17:
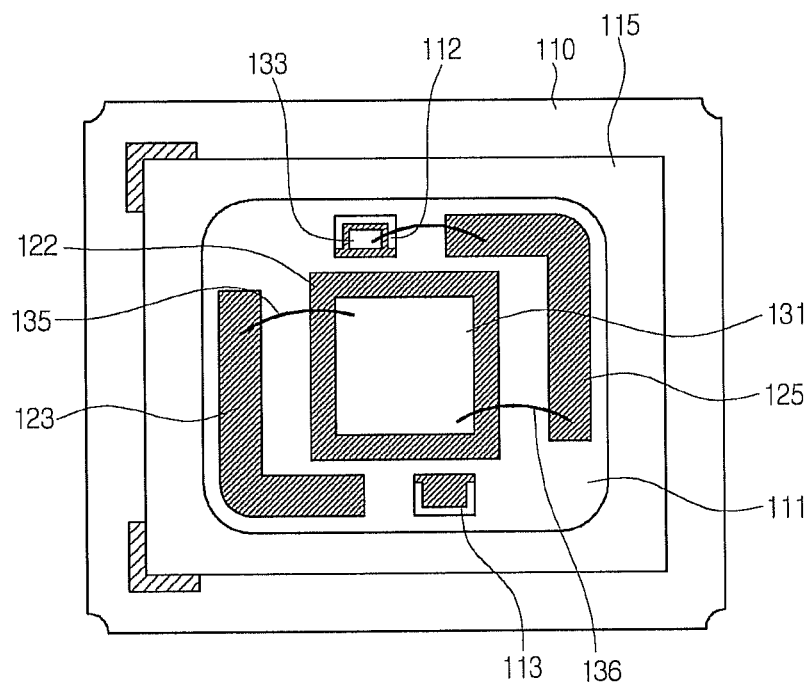
FIG. 17 is a plan view illustrating a light emitting device package according to a sixth embodiment.

FIG. 17 is a plan view illustrating a light emitting device package according to a sixth embodiment.

Referring to FIG. 17, first and second electrodes 122 and 123 of the light emitting device package may be positive electrodes, and a third electrode 125 of the light emitting device package may be a negative electrode. A LED 131 may be connected to the second electrode 123 and the third electrode 125 through at least two connection members 135 and 136. The connection members 135 and 136 include wires.

The LED 131 may be only in physical contact with the first electrode 122 without electric connection with the first electrode 122.

Figure 18:
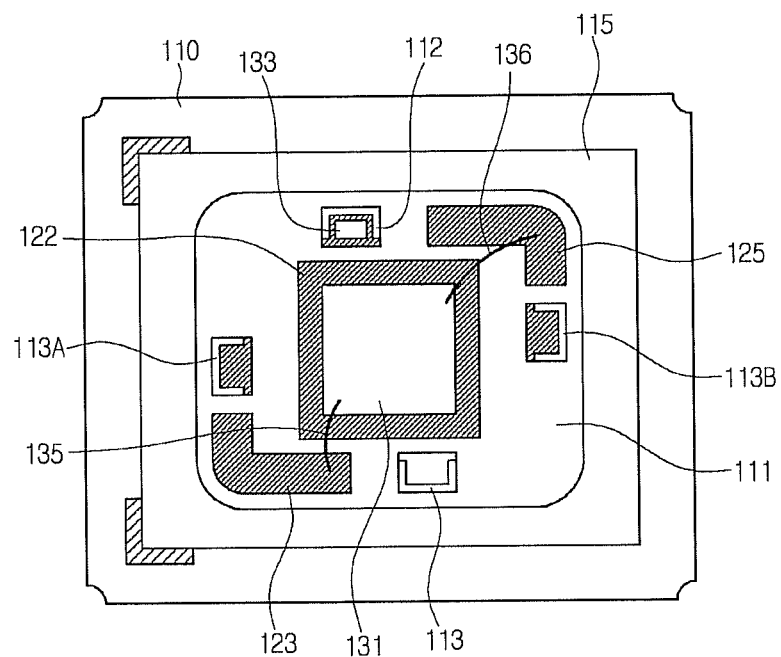
FIG. 18 is a sectional view illustrating a light emitting device package according to a seven embodiment.

FIG. 18 is a plan view illustrating a light emitting device package according to a seventh embodiment.

Referring to FIG. 18, at least four sub cavities 112, 113, 113A, and 113B are disposed in a cavity 111 of the light emitting device package, and a protection device 133 is disposed at least one of the four sub cavities 112, 113, 113A, and 113B. If the light emitting device package includes a plurality of LEDs 131, protection devices may be disposed in at least two of the sub cavities 112, 113, 113A, and 113B for protecting the LEDs 131. However, the current embodiment is not limited thereto.

The sub cavities 112, 113, 113A, and 113B are symmetrically arranged with respect to the center of an LED 131. Therefore, imbalance heat dissipation can be prevented in the cavity 111, and thus distortion of a body 110 can be prevented. As a result, separation of the LED 131 or wires from bonding portions can be prevented.

Figure 19:
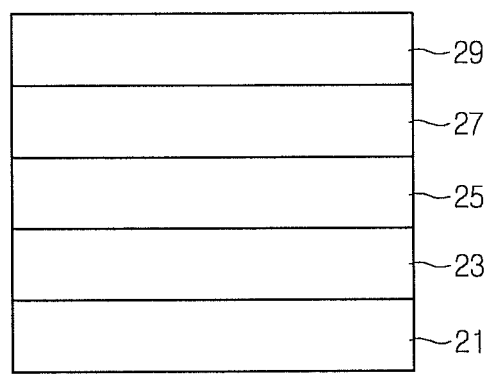
FIG. 19 is a view illustrating a light emitting diode (LED) according to an embodiment.

FIG. 19 illustrates an ultraviolet LED 131 according to an embodiment.

Referring to FIG. 19, the LED 131 has a vertical electrode structure. The LED 131 includes a first electrode layer 21, a first conductive type semiconductor layer 23, an active layer 25, a second conductive type semiconductor layer 27, and a second electrode layer 29. Alternatively, the LED 131 may have a horizontal electrode structure. That is, the scope and spirit of the present disclosure is not limited to the type of the LED 131.

The first electrode layer 21 may include a conductive support substrate or may function as a pad. The first electrode layer 21 may be used as a substrate on which a compound semiconductor can grow.

A group III-V nitride semiconductor layer grows on the first electrode layer 21. Examples of semiconductor growth apparatus includes an E-beam evaporator apparatus, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus. However, the growth apparatus is not limited thereto.

The first conductive type semiconductor layer 23 is disposed on the first electrode layer 21. The first conductive type semiconductor layer 23 may be formed of at least one of group II-VI or III-V compound semiconductors such as GaN, InN, AlN, InGaN, AlGaN, InAlGaN, and AlInN. The first conductive type semiconductor layer 23 may be doped with a first conductive type dopant. The first conductive type dopant may be an N-type dopant. At least one of Si, Ge, Sn, Se, and Te may be added to the first conductive type semiconductor layer 23 as the first conductive type dopant.

A current spreading structure is included in a predetermined region of the first conductive type semiconductor layer 23. The current spreading structure includes semiconductor layers in which a current spreads more rapidly in a horizontal direction than in a vertical direction. The current spreading structure may include a plurality of semiconductor layers having different dopant concentrations or conductivities.

The active layer 25 is disposed on the first conductive type semiconductor layer 23, and the active layer 25 may has a single quantum well structure or a multi quantum well (MQW) structure. The active layer 25 may include a series of barrier layer/well layer. The barrier layer/well layer may be at least one of GaN/InGaN, AlGaN/InGaN, InGaN/InGaN, GaN/AlGaN, AlGaN/GaN, and InAlGaN/InAlGaN.

A first conductive type cladding layer (not shown) may be disposed between the first conductive type semiconductor layer 23 and the active layer 25, and a second conductive type cladding layer (not shown) may be disposed between the second conductive type semiconductor layer 27 and the active layer 25. Each of the conductive type cladding layers may be formed of a compound semiconductor material having an energy band greater than the energy band gap of a well layer of the active layer 25.

The second conductive type semiconductor layer 27 is disposed on the active layer 25. The second conductive type semiconductor layer 27 may be a P-type semiconductor layer doped with a second conductive type dopant. For example, the P-type semiconductor layer may be formed of one of compound semiconductor materials such as GaN, InN, AlN, InGaN, AlGaN, InAlGaN, and AlInN. The second conductive type dopant may be a P-type dopant such as Mg, Zn, Ca, Sr, and Ba.

A current spreading structure is included in a predetermined region of the second conductive type semiconductor layer 27. The current spreading structure includes semiconductor layers in which a current spreads more rapidly in a horizontal direction than in a vertical direction.

Also, the first conductive type semiconductor layer 23 may include a P-type semiconductor layer, and the second conductive type semiconductor layer 27 may be an N-type semiconductor layer. A light emitting structure may be formed of one of an n-p junction structure, a p-n junction structure, an n-p-n junction structure, and a p-n-p junction structure. In the following description, the case where the second conductive type semiconductor layer 27 is the uppermost semiconductor layer will be explained as an example.

The second electrode layer 29 is disposed on the second conductive type semiconductor layer 27. The second electrode 29 may include a p-side pad and/or an electrode layer. The electrode layer may be a transparent layer formed of an oxide or a nitride, such as ITO (indium tin oxide), ITON (indium tin oxide nitride), IZO (indium zinc oxide), IZON (indium zinc oxide nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, and NiO.

The second electrode layer 29 may function as a current spreading layer for spreading a current. In addition, the second electrode layer 29 may be a reflective electrode layer formed of Ag, Ni, Al, Rh, Pd, Ir, Ru, Mg, Zn, Pt, Au, Hf, and a combination thereof. The second electrode layer 29 may include a metal layer having a single-layer or multi-layer structure.

Figure 20:
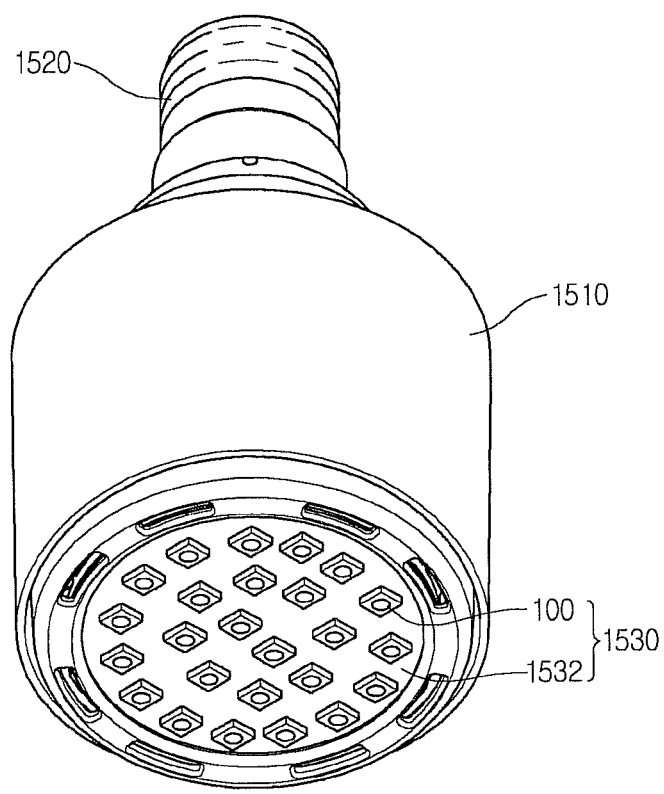
FIG. 20 is a perspective view illustrating an ultraviolet (UV) lamp including a light emitting device package according to an embodiment.

FIG. 20 is a perspective view illustrating an ultraviolet (UV) lamp including light emitting device packages according to an embodiment.

Referring to FIG. 20, a lighting system 1500 may include a case 1510, a light emitting module 1530 disposed in the case 1510, and a connection terminal 1520 disposed on the case 1510 to receive power from an external power source.

The case 1510 may be formed of a material having good heat dissipation characteristics, such as a metal material or a resin material.

The light emitting module 1530 may include: a module board 1532; and light emitting device packages 100 such as that described in the above embodiments. The light emitting device packages 100 are disposed on the module board 1532. The light emitting device packages 100 may be arranged in a matrix format or at predetermined intervals.

The module board 1532 may be a board in which circuit patterns are printed on an insulator. Examples of the module board 1532 may include a general printed circuit board (PCB), a metal core PCB, a flexible PCB, a ceramic PCB, and an FR-4 board.

In addition, the module board 1532 may be formed of a material capable of reflecting light efficiently. Alternatively, the board module board 1532 may be coated with a color layer such as a white or silver layer for efficiently reflecting light.

At least one light emitting device package 100 as is described in the previous embodiments may be disposed on the module board 1532. Each of the light emitting device package 100 may include at least one ultraviolet LED. The ultraviolet LED may emit light having a wavelength of 245 nm to 405 nm. That is, any LED capable of emitting short-wavelength ultraviolet rays having a wavelength of about 280 nm or long-wavelength ultraviolet rays having a wavelength of 365 nm or 385 nm may be used.

The connection terminal 1520 may be electrically connected to the light emitting module 1530 to supply power. The connection terminal 1520 may be a screw terminal that can be coupled to an external power source socket. However, the current embodiment is not limited thereto. For example, the connection terminal 1520 may be formed in a pin shape. In this case, the connection terminal 1120 may be inserted into an external power source or connected to the external power source by using a cable.

According to the embodiments, the protection device such as a Zener diode is disposed in the light emitting device package to protect the ultraviolet LED. In the embodiments, although the protection device is disposed in the cavity of the light emitting device package, light extraction efficiency is not decreased, and the directional angle of light is not distorted by the protective device. According to the embodiments, since the heat dissipation member is disposed in the light emitting device package, heat dissipation efficiency can be improved. In addition, permeation of moisture is suppressed by making corners of the cavity round. According to the embodiments, any LED emitting light having a wavelength of 245 nm to 405 nm can be used in the light emitting device package. That is, different packages are not necessary for LEDs emitting light having different wavelengths.

According to the embodiments, although the body of the light emitting device package is formed of a ceramic material, the ceramic body can undergo uniform thermal expansion owing to the sub cavities disposed at symmetric positions with respect to the LED. Therefore, the light emitting device package formed of a ceramic material can be thermally stable. According to the embodiments, the ultraviolet lamp including ultraviolet light emitting device packages can have improved reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body comprising a cavity, wherein the cavity includes a first cavity with an opened topside and a second cavity under the first cavity, wherein the body includes a ceramic material, and wherein the second cavity includes a sub-cavity;
a heat dissipation member between a bottom surface of the second cavity and a lower surface of the body, wherein the heat dissipation member includes a metal material;
a plurality of metal layers disposed on the bottom surface of the second cavity, the plurality of metal layers including a first metal layer, a second metal layer adjacent to the first metal layer and a third metal layer adjacent to the first metal layer;
a plurality of pads disposed on the lower surface of the body and electrically connected to at least two of the plurality of metal layers; and
a light emitting diode (LED) that emits a wavelength of 245 nm to 405 nm, and the light emitting diode is disposed on the first metal layer disposed on the bottom surface of the second cavity, the light emitting diode being electrically connected to at least two of the plurality of metal layers,
wherein entire lateral surfaces of the heat dissipation member are surrounded by the body,
wherein the first cavity has a stepped structure from a top surface of the body,
wherein at least one region of the bottom surface of the second cavity is disposed at a lower position than a position of a bottom surface of the light emitting diode,
wherein the body includes a first portion under the light emitting diode, and a second portion around the light emitting diode and disposed on the first portion,
wherein the heat dissipation member is disposed in the first portion of the body and includes a first heat dissipation portion facing the bottom surface of the light emitting diode and a second heat dissipation portion opposite to the first heat dissipation portion,
wherein the first metal layer is disposed between the bottom surface of the light emitting diode and the first heat dissipation portion, and the first metal layer has a width smaller than a width of the bottom surface of the second cavity,
wherein the second and third metal layers are disposed on opposite sides with respect to the first metal layer, and bottom surfaces of the second and third metal layers are disposed at a same height with each other,
wherein the light emitting diode has a first corner and a second corner in a diagonal direction with respect to each other,
wherein the second metal layer is disposed outside the first corner of the light emitting diode and two lateral sides of the light emitting diode directly adjacent to the first corner,
wherein the third metal layer is disposed outside the second corner of the light emitting diode and two lateral sides of the light emitting diode directly adjacent to the second corner,
wherein the heat dissipation member includes a plurality of protrusions extended in a direction from a lateral surface of the heat dissipation member to a lateral surface of the body,
wherein lateral surfaces of the plurality of protrusions are surrounded by the body and contact the first portion of the body,
wherein the plurality of protrusions include a first protrusion extended from a top surface of the heat dissipation member and a second protrusion extended from a bottom surface of the heat dissipation member toward the lateral surface of the body,
wherein a top surface of the first protrusion is a horizontal surface that acts as the top surface of the heat dissipation member disposed under the first metal layer, and
wherein the top surface of the first protrusion is disposed at a lower height than a height of the bottom surface of the light emitting diode based on a bottom surface of the body.

2. The light emitting device package according to claim 1, further comprising a buffer layer disposed under the heat dissipation member and having a width wider than a width of the bottom surface of the heat dissipation member, and the buffer layer having a thickness of 50 μm or less.

3. The light emitting device package according to claim 1, wherein the width of the first metal layer is wider than a width of the top surface of the heat dissipation member.

4. The light emitting device package according to claim 1,
wherein the first protrusion and the second protrusion have a different width, and
wherein an entire surface of the heat dissipation member is not exposed to the bottom surface and the lateral surface of the body.

5. The light emitting device package according to claim 1, wherein the top surface of the heat dissipation member has a roughness.

6. The light emitting device package according to claim 1, wherein the heat dissipation member comprises copper (Cu) and tungsten (W) materials, and has a thickness of 150 μm and greater.

7. The light emitting device package according to claim 1, further comprising a protection device disposed in the sub-cavity.

8. The light emitting device package according to claim 1, wherein at least one of the plurality of metal layers has multiple layer structure including a first layer and a second layer formed subsequently on the first layer, wherein the first layer has nickel (Ni) material and the second layer has gold (Au).

9. The light emitting device package according to claim 1, further comprising a conductive bonding layer having a thickness of about 5 μm and disposed between the first metal layer and the light emitting diode, and an optical transparent member covering the second cavity.

10. The light emitting device package according to claim 9, wherein the conductive bonding layer includes materials of gold (Au) and tin (Sn).

11. The light emitting device package according to claim 9, further comprising a plurality of connection members electrically connected to at least one of the plurality of metal layers, and
wherein the plurality of connection members vertically extend toward the lower surface of the body.

12. A light emitting device package comprising:
a body comprising a cavity, wherein the cavity includes a first cavity with an opened topside and a second cavity under the first cavity, wherein the body includes a ceramic material, and wherein the second cavity includes a sub-cavity;
a plurality of metal layers disposed on a bottom surface of the second cavity, wherein the plurality of metal layers include a first metal layer disposed in a first region of the bottom surface of the second cavity, a second metal layer spaced apart from the first metal layer, and a third metal layer spaced apart from the first metal layer;
a plurality of pads including a first pad and a second pad disposed on a lower surface of the body;
a light emitting diode on the first metal layer, the light emitting diode being electrically connected to at least one of the plurality of metal layers, and the light emitting diode for emitting a wavelength of 245 nm to 405 nm; and
a heat dissipation member disposed in the body and disposed between the first metal layer and the first pad, wherein the heat dissipation member includes Cu or CuW,
wherein at least one of a top surface and a bottom surface of the heat dissipation member has a roughness,
wherein the bottom surface of the heat dissipation member is overlapped vertically with the bottom surface of the second cavity,
wherein entire lateral surfaces of the heat dissipation member are surrounded by the body,
wherein the first cavity has a stepped structure from a top surface of the body,
wherein at least one region of the bottom surface of the second cavity is disposed at a lower position than a position of a bottom surface of the light emitting diode,
wherein the body includes a first portion comprising a ceramic material and disposed under the light emitting diode, and a second portion around the light emitting diode, and the second portion is disposed on the first portion,
wherein the heat dissipation member is disposed in the first portion of the body and includes a first heat dissipation portion facing the bottom surface of the light emitting diode and a second heat dissipation portion opposite to the first heat dissipation portion,
wherein the first metal layer is disposed between the bottom surface of the light emitting diode and a top surface of the heat dissipation member, not electrically connected to the light emitting diode, and has a width smaller than a width of the bottom surface of the second cavity,
wherein the second and third metal layers are disposed on opposite sides with respect to the first metal layer,
wherein the light emitting diode has a first corner and a second corner in a diagonal direction with respect to each other,
wherein the second metal layer is disposed outside the first corner of the light emitting diode and two lateral sides of the light emitting diode directly adjacent to the first corner,
wherein the third metal layer is disposed outside the second corner of the light emitting diode and two lateral sides of the light emitting diode directly adjacent to the second corner,
wherein the heat dissipation member includes a plurality of protrusions extended in a direction from a lateral surface of the heat dissipation member to a lateral surface of the body,
wherein lateral surfaces of the plurality of protrusions are surrounded by the body and contact the first portion of the body,
wherein the plurality of protrusions include a first protrusion extended from the top surface of the heat dissipation member and a second protrusion extended from a bottom surface of the heat dissipation member toward the lateral surface of the body, and
wherein a top surface of the first protrusion is a horizontal surface that acts as the top surface of the heat dissipation member disposed under the first metal layer,
wherein the top surface of the first protrusion is disposed at a lower height than a height of the bottom surface of the light emitting diode based on a bottom surface of the body, and
wherein an entire surface of the heat dissipation member is not exposed to the bottom surface and the lateral surface of the body.

13. The light emitting device package according to claim 12, further comprising a glass film disposed on an upper surface of the first cavity,
wherein a top surface of the glass film is lower than the top surface of the body,
wherein the glass film has a width wider than a width of a first region of the second cavity,
wherein the glass film has a thickness smaller than a height of the first region of the second cavity.

14. The light emitting device package according to claim 12, further comprising a buffer layer including a metal material different from a material of the heat dissipation member,
   wherein the buffer layer is disposed under the heat dissipation member.

15. The light emitting device package according to claim 12, wherein the first pad is vertically overlapped with the heat dissipation member, and
   wherein a width of the opened topside of the first cavity is wider than a width of the top surface of the heat dissipation member.

16. The light emitting device package according to claim 12, wherein the second and third metal layers are disposed at a same height with each other.

17. The light emitting device package according to claim 12,
   wherein the first protrusion and the second protrusion have a different width.

18. The light emitting device package according to claim 12, further comprising a protection device disposed in the sub-cavity, and
   wherein a size of the sub-cavity is smaller than a size of the light emitting diode.

19. The light emitting device package according to claim 18, further comprising a metal layer between the protection device and the sub-cavity, and
   wherein the sub-cavity has a depth ranging from ½ to ¼ of a depth of the second cavity.

20. An ultraviolet lamp comprising:
   a light emitting device package; and
   a module board on which the light emitting device package is disposed,
   wherein the light emitting device package comprises:
      a body having a cavity, wherein the cavity includes a first cavity with an opened topside and a second cavity under the first cavity, wherein the body includes a ceramic material, and wherein the second cavity includes a sub-cavity;
      a heat dissipation member disposed between a bottom surface of the second cavity and a lower surface of the body, wherein the heat dissipation member includes a metal material;
      a plurality of metal layers disposed on the bottom surface of the second cavity, the plurality of metal layers including a first metal layer, a second metal layer adjacent to the first metal layer and a third metal layer adjacent to the first metal layer;
      a plurality of pads disposed on the lower surface of the body and electrically connected to at least two of the plurality of metal layers; and
      a light emitting diode that emits a wavelength of 245 nm to 405 nm disposed on the first metal layer arranged on the bottom surface of the second cavity, the light emitting diode being electrically connected to at least two of the plurality of metal layers,
   wherein entire lateral surfaces of the heat dissipation member are surrounded by the body,
   wherein the first cavity has a stepped structure from a top surface of the body,
   wherein at least one region of the bottom surface of the second cavity is disposed at a lower position than a position of a bottom surface of the light emitting diode,
   wherein the body includes a first portion under the light emitting diode, and a second portion around the light emitting diode and disposed on the first portion,
   wherein the heat dissipation member is disposed in the first portion of the body and includes a first heat dissipation portion facing the bottom surface of the light emitting diode and a second heat dissipation portion opposite to the first heat dissipation portion,
   wherein the first metal layer is disposed between the bottom surface of the light emitting diode and the first heat dissipation portion, and the first metal layer has a width smaller than a width of the bottom surface of the second cavity,
   wherein the second and third metal layers are disposed on opposite sides with respect to the first metal layer, and bottom surfaces of the second and third metal layers are disposed at a same height with each other,
   wherein the light emitting diode has a first corner and a second corner in a diagonal direction with respect to each other,
   wherein the second metal layer is disposed outside the first corner of the light emitting diode and two lateral sides of the light emitting diode directly adjacent to the first corner,
   wherein the third metal layer is disposed outside the second corner of the light emitting diode and two lateral sides of the light emitting diode directly adjacent to the second corner,
   wherein the heat dissipation member includes a plurality of protrusions extended in a direction from a lateral surface of the heat dissipation member to a lateral surface of the body,
   wherein lateral surfaces of the plurality of protrusions are surrounded by the body and contact the first portion of the body,
   wherein the plurality of protrusions include a first protrusion extended from a top surface of the heat dissipation member and a second protrusion extended from a bottom surface of the heat dissipation member toward the lateral surface of the body, and
   wherein a top surface of the first protrusion is a horizontal surface that acts as the top surface of the heat dissipation member disposed under the first metal layer, and
   wherein the top surface of the first protrusion is disposed at a lower height than a height of the bottom surface of the light emitting diode based on a bottom surface of the body.

* * * * *